(12) United States Patent
Morris

(10) Patent No.: US 9,137,935 B2
(45) Date of Patent: Sep. 15, 2015

(54) ELECTROMAGNETIC FIELD ASSISTED SELF-ASSEMBLY WITH FORMATION OF ELECTRICAL CONTACTS

(71) Applicant: U.S. Army Research Laboratory, Adelphi, MD (US)

(72) Inventor: Christopher James Morris, Silver Spring, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 14/497,377

(22) Filed: Sep. 26, 2014

(65) Prior Publication Data
US 2015/0048148 A1    Feb. 19, 2015

Related U.S. Application Data

(62) Division of application No. 13/366,436, filed on Feb. 6, 2012.

(51) Int. Cl.
*B23K 31/02*   (2006.01)
*H05K 13/00*   (2006.01)
(Continued)

(52) U.S. Cl.
CPC .......... *H05K 13/0015* (2013.01); *B23K 1/0016* (2013.01); *B23K 1/20* (2013.01); *H01L 24/81* (2013.01); *H01L 24/95* (2013.01); *H05K 3/303* (2013.01); *H05K 13/027* (2013.01); *H05K 13/04* (2013.01); *H01L 24/05* (2013.01); *H01L 24/13* (2013.01); *H01L 2224/0401* (2013.01); *H01L 2224/05644* (2013.01); *H01L 2224/05647* (2013.01); *H01L 2224/05655* (2013.01); *H01L 2224/13111* (2013.01); *H01L 2224/29111* (2013.01); *H01L 2224/81002* (2013.01);

(Continued)

(58) Field of Classification Search
None
See application file for complete search history.

(56) References Cited

U.S. PATENT DOCUMENTS 2,991,347 A * 7/1961 Weinstein ................... 219/85.16
3,397,278 A * 8/1968 Pomerantz ..................... 257/650
(Continued)

FOREIGN PATENT DOCUMENTS

JP    58171233 A  * 10/1983  ............... B23Q 3/15

OTHER PUBLICATIONS

Tien, J., et al., "Crystallization of Millimeter-Scale Objects with Use of Capillary Forces", Journal of the American Chemical Society, 120(48), 1998, pp. 12670-12671.

(Continued)

*Primary Examiner* — Kiley Stoner
(74) *Attorney, Agent, or Firm* — Guy M. Miller

(57) ABSTRACT

A method and apparatus for self-assembling a part on a substrate are disclosed herein. In some embodiments, a method includes placing a substrate having a first binding site capable of generating a first magnetic field and having a first shaped surface with a first droplet conformably disposed thereon into a first fluid; placing a part having a second binding site capable of generating a second magnetic field and having a second shaped surface with a second droplet conformably disposed on the second shaped surface into the first fluid; and attracting the part towards the first binding site such that an equilibrium is formed between an attractive force and a repulsive force such that the part is free to rotate about the first binding site to minimize the repulsive force when the first and second shaped surfaces rotate into an alignment causing the part to aligned with the first binding site.

16 Claims, 4 Drawing Sheets

(51) Int. Cl.

| | |
|---|---|
| *B23K 1/00* | (2006.01) |
| *B23K 1/20* | (2006.01) |
| *H05K 3/30* | (2006.01) |
| *H01L 23/00* | (2006.01) |
| *H05K 13/02* | (2006.01) |
| *H05K 13/04* | (2006.01) |
| *H05K 3/34* | (2006.01) |

(52) U.S. Cl.
CPC ............... *H01L2224/81085* (2013.01); *H01L 2224/81444* (2013.01); *H01L 2224/81447* (2013.01); *H01L 2224/81455* (2013.01); *H01L 2224/95001* (2013.01); *H01L 2224/95085* (2013.01); *H01L 2224/95133* (2013.01); *H01L 2924/0132* (2013.01); *H01L 2924/10156* (2013.01); *H05K 3/3436* (2013.01); *H05K 2201/083* (2013.01); *H05K 2203/04* (2013.01); *H05K 2203/048* (2013.01); *H05K 2203/0776* (2013.01); *H05K 2203/104* (2013.01)

(56) References Cited

U.S. PATENT DOCUMENTS

| | | | | |
|---|---|---|---|---|
| 3,855,693 | A * | 12/1974 | Umbaugh | 29/843 |
| 3,887,997 | A * | 6/1975 | Hartleroad et al. | 228/180.21 |
| 5,005,757 | A * | 4/1991 | Kornely et al. | 228/178 |
| 5,346,775 | A * | 9/1994 | Jin et al. | 428/614 |
| 5,355,577 | A * | 10/1994 | Cohn | 29/592.1 |
| 5,478,778 | A * | 12/1995 | Tanisawa | 438/25 |
| 5,539,153 | A * | 7/1996 | Schwiebert et al. | 174/260 |
| 5,545,291 | A | 8/1996 | Smith et al. | |
| 5,824,186 | A | 10/1998 | Smith et al. | |
| 5,986,348 | A * | 11/1999 | Fukano | 257/780 |
| 6,011,307 | A * | 1/2000 | Jiang et al. | 257/746 |
| 6,186,392 | B1 * | 2/2001 | Ball | 228/245 |
| 6,239,385 | B1 * | 5/2001 | Schwiebert et al. | 174/261 |
| 6,251,765 | B1 * | 6/2001 | Fukano et al. | 438/612 |
| 6,527,964 | B1 | 3/2003 | Smith et al. | |
| 6,536,106 | B1 | 3/2003 | Jackson et al. | |
| 6,599,465 | B1 * | 7/2003 | Reppel et al. | 419/5 |
| 6,605,453 | B2 | 8/2003 | Ozkan et al. | |
| 6,687,987 | B2 | 2/2004 | Mayer et al. | |
| 6,709,966 | B1 * | 3/2004 | Hisatsune et al. | 438/613 |
| 6,780,696 | B1 | 8/2004 | Schatz | |
| 6,864,570 | B2 | 3/2005 | Smith | |
| 6,909,185 | B1 * | 6/2005 | Kondo et al. | 257/746 |
| 6,974,604 | B2 | 12/2005 | Hunter et al. | |
| 7,018,575 | B2 | 3/2006 | Brewer et al. | |
| 7,223,635 | B1 | 5/2007 | Brewer | |
| 7,232,704 | B2 | 6/2007 | Singh | |
| 7,253,091 | B2 | 8/2007 | Brewer et al. | |
| 7,584,533 | B2 * | 9/2009 | Smeys et al. | 29/604 |
| 8,850,695 | B1 * | 10/2014 | Call et al. | 29/739 |
| 9,015,930 | B2 * | 4/2015 | Maeda et al. | 29/744 |
| 2005/0230827 | A1 * | 10/2005 | Naito et al. | 257/737 |
| 2005/0239261 | A1 * | 10/2005 | Tai et al. | 438/380 |
| 2006/0022784 | A1 * | 2/2006 | Kopp | 336/100 |
| 2006/0030071 | A1 * | 2/2006 | Mizukoshi et al. | 438/106 |
| 2006/0048384 | A1 * | 3/2006 | Ricks et al. | 29/830 |
| 2006/0051517 | A1 * | 3/2006 | Haas et al. | 427/457 |
| 2006/0172126 | A1 * | 8/2006 | Long et al. | 428/209 |
| 2006/0197213 | A1 * | 9/2006 | Lian et al. | 257/687 |
| 2006/0223205 | A1 | 10/2006 | Jacobs et al. | |
| 2006/0234405 | A1 * | 10/2006 | Best | 438/15 |
| 2007/0001313 | A1 * | 1/2007 | Fujimoto et al. | 257/778 |
| 2007/0037379 | A1 * | 2/2007 | Enquist et al. | 438/618 |
| 2007/0231826 | A1 * | 10/2007 | Huber et al. | 435/7.1 |
| 2007/0231961 | A1 * | 10/2007 | Teshirogi et al. | 438/107 |
| 2008/0068816 | A1 * | 3/2008 | Han et al. | 361/760 |
| 2008/0131670 | A1 * | 6/2008 | Sun | 428/198 |
| 2008/0218299 | A1 * | 9/2008 | Arnold | 335/306 |
| 2008/0308953 | A1 * | 12/2008 | Autumn et al. | 257/783 |
| 2010/0165590 | A1 * | 7/2010 | Ishizaki | 361/760 |
| 2010/0170086 | A1 * | 7/2010 | Ramadan et al. | 29/834 |
| 2010/0214747 | A1 * | 8/2010 | Jacobs et al. | 361/729 |
| 2010/0225434 | A1 * | 9/2010 | Wang et al. | 336/200 |
| 2010/0232220 | A1 * | 9/2010 | Meade et al. | 365/171 |
| 2011/0115078 | A1 * | 5/2011 | Jeong et al. | 257/737 |
| 2011/0179640 | A1 * | 7/2011 | Arnold et al. | 29/825 |
| 2011/0223776 | A1 * | 9/2011 | Ferber, Jr. | 439/39 |
| 2011/0266030 | A1 * | 11/2011 | Swaminathan et al. | 174/126.2 |
| 2011/0278044 | A1 * | 11/2011 | Aleksov et al. | 174/126.1 |
| 2011/0278351 | A1 * | 11/2011 | Aleksov et al. | 228/234.1 |
| 2011/0281375 | A1 * | 11/2011 | Swaminathan et al. | 438/3 |
| 2011/0284262 | A1 * | 11/2011 | Chappell et al. | 174/126.1 |
| 2012/0228752 | A1 * | 9/2012 | Huang | 257/660 |
| 2012/0313236 | A1 * | 12/2012 | Wakiyama et al. | 257/734 |
| 2013/0020716 | A1 * | 1/2013 | Kuczynski et al. | 257/774 |
| 2013/0153645 | A1 * | 6/2013 | Owens et al. | 228/180.22 |
| 2013/0199831 | A1 * | 8/2013 | Morris | 174/260 |
| 2013/0228916 | A1 * | 9/2013 | Mawatari | 257/737 |
| 2013/0252375 | A1 * | 9/2013 | Yi et al. | 438/107 |
| 2013/0277831 | A1 * | 10/2013 | Yoon et al. | 257/737 |
| 2014/0065847 | A1 * | 3/2014 | Salmon et al. | 439/39 |
| 2014/0070393 | A1 * | 3/2014 | Bartley et al. | 257/690 |
| 2015/0050761 | A1 * | 2/2015 | Karlicek et al. | 438/28 |

OTHER PUBLICATIONS

Srinivasan, U., et al., "Microstructure to Substrate Self-Assembly Using Capillary Forces", Journal of Microelectromechanical Systems, vol. 10, No. 1, Mar. 2001, pp. 17-24.

Clark, Thomas D., et al., "Self-Assembly of 10 µm-Sized Objects into Ordered Three-Dimensional Arrays", J. Am. Chem. Soc. 2001, 123, pp. 7677-7682.

Srinivasan, Uthara, et al., "Fluidic Self-Assembly of Micromirrors Onto Microactuators Using Capillary Forces", IEEE Journal on Selected Topics in Quantum Electronics, vol. 8, No. 1, Jan./Feb. 2002, pp. 4-11.

Jacobs, H. O., et al., "Fabrication of a Cylindrical Display by Patterned Assembly", Science, vol. 296, Apr. 12, 2002, pp. 323-325.

Xiong, Xiaorong, et al., "Controlled Multibatch Self-Assembly of Microdevices", Journal of Microelectromechanical Systems, vol. 12, No. 2, Apr. 2003, pp. 117-127.

Scott, Karen L., et al., "High-Performance Inductors Using Capillary Based Fluidic Self-Assembly", Journal of Microelectromechanical Systems, vol. 13, No. 2, Apr. 2004, pp. 300-309.

Zheng, W., et al., "Sequential Shape-and-Solder-Directed Self-Assembly of Functional Microsystems", Proceedings of of the National Academy of Sciences of the United Sates of America, vol. 101, No. 35, pp. 12814-12817.

Fang, J., et al., "Wafer-Level Packaging Based on Uniquely Orienting Self-Assembly(The DUO-SPASS Processes)", Journal of Microelectromechanical Systems, vol. 15, No. 3, Jun. 2006, pp. 531-540.

Chung, Jaehoon, et al., "Programmably Reconfigurable Self-Assembly: Parallel Heterogeneous Integration of Chip-Scale Components on Planar and Nonplanar Surfaces", Journal of Microelectromechanical Systems, vol. 15, No. 3, Jun. 2006, pp. 457-464.

Zheng, Wei, et al., "Fluidic Heterogenous Microsystems Assembly and Packaging", Journal of Microelectromechanical Systems, vol. 15, No. 4, Aug. 2006, pp. 864-870.

Strauth, Sean A., et al., "Self-Assembled Single-Crystal Silicon Circuits on Plastic", Proceedings of the National Academy of Sciences of the United States of America, vol. 103, No. 38, Sep. 19, 2006, pp. 13922-13927.

Ramadan, Qasem, et al., "Large Scale Microcomponents Assembly Using an External Magnetic Array", Applied Physics Letters, vol. 90, No. 17, pp. 172502-172503.

Shetye, Sheetal B., et al., "Investigation of Microscale Magnetic Forces for Magnet Array Self-Assembly", IEEE Transactions on Magnetics, vol. 43, No. 6, Jun. 2007, pp. 2713-2715.

Morris, Christopher J., et al., "Micro-scale Metal Contacts for Capillary Force-Driven Self-Assembly", Journal of Micromechanics and Microengineering, vol. 18, No. 1, pp. 015022 (10 pp.).

(56) References Cited

OTHER PUBLICATIONS

Shetye, Sheetal B., et al., "Self-Assembly of Millimeter-Scale Components Using Integrated Micromagnets", IEEE Transactions on Magnetics, vol. 44, No. 11, Nov. 2008, pp. 4293-4296.

Morris, Christopher J., et al., "Microscale Self-Assembly Using Molten Alloys with Different Melting Points", Journal of Vacuum Science & Technology, vol. B26, No. 6, Nov./Dec. 2008, pp. 2534-2538.

Chapius, Y. A., et al., "Alternative Approach in 3D MEMS-IC Integration Using Fluidic Self-Assembly Techniques", Journal of Micromechanics and Microengineering, vol. 19, No. 10, pp. 105002 (9 pp).

Morris, Christopher J., et al., "Self-Assembly of Microscale Parts Through Magnetic and Capillary Interactions", Micromachines 2011, 2, pp. 69-81.

* cited by examiner

ELECTROMAGNETIC FIELD ASSISTED SELF-ASSEMBLY WITH FORMATION OF ELECTRICAL CONTACTS

CROSS REFERENCE TO RELATED APPLICATION

This application is a divisional application of and claims priority to U.S. patent application Ser. No. 13/366,436, entitled "Electromagnetic Field Assisted Self-Assembly With Formation of Electrical Contacts," by Christopher Morris filed Feb. 6, 2012, herein incorporated by reference in its entirety.

GOVERNMENT INTEREST

Governmental Interest—The invention described herein may be manufactured, to used and licensed by or for the U.S. Government.

FIELD OF INVENTION

Embodiments of the present invention generally relate to methods of self-assembly and apparatus for accomplishing the same.

BACKGROUND OF THE INVENTION

Self-assembly is a promising technique to overcome limitations, for example, with integrating, packaging, and/or handling individual electronic components that have critical dimensions of about 300 microns or below. Methods of self-assembly may include gravitational, capillary, or magnetic forces, each of which has limitations related to assembling one or more electronic components on a substrate, for example, such as aligning one or more electronic components with a binding site on the substrate.

The inventor has provided improved methods and apparatus for self-assembly.

BRIEF SUMMARY OF THE INVENTION

Embodiments of the present invention include methods and apparatus for self-assembling a part on a substrate. In some embodiments, a method of self-assembling a part on a substrate includes placing a substrate into a first fluid, the substrate including a first binding site capable of generating a first electromagnetic field and having a first shaped surface with a first droplet conformably disposed on the first shaped surface, wherein the first droplet is immiscible in the first fluid; placing a part into the first fluid, the part having a second binding site capable of generating a second electromagnetic field and having a second shaped surface with a second droplet conformably disposed on the second shaped surface, wherein the second droplet is immiscible in the first fluid; and attracting the part towards the first binding site using the first and second electromagnetic fields such that the first and second droplets solubilize with each other forming an equilibrium between an attractive force between the first and second electromagnetic fields and a repulsive force between the solubilized first and second droplets and the first fluid such that the part is free to rotate about the first binding site to minimize the repulsive force by minimizing an exposed surface area of the solubilized first and second droplets with respect to the first fluid when the first and second shaped surfaces rotate into an alignment causing the part to aligned with the first binding site.

In some embodiments, an apparatus includes a substrate having a first binding site having a first shaped surface and a first electromagnetic field generating element; and a part having a second binding opposing the first binding site, wherein the second binding site has a second shaped surface and a second electromagnetic field generating element and wherein the first shaped surface is aligned with the second shaped surface.

Other and further embodiments of the present invention are discussed below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Embodiments of the present invention comprise methods and apparatus for self-assembling a part on a substrate. The inventive methods and apparatus advantageously facilitate the self-assembly of the part onto the substrate such that the part and the substrate are aligned during the self-assembly process.

Figure 1A:
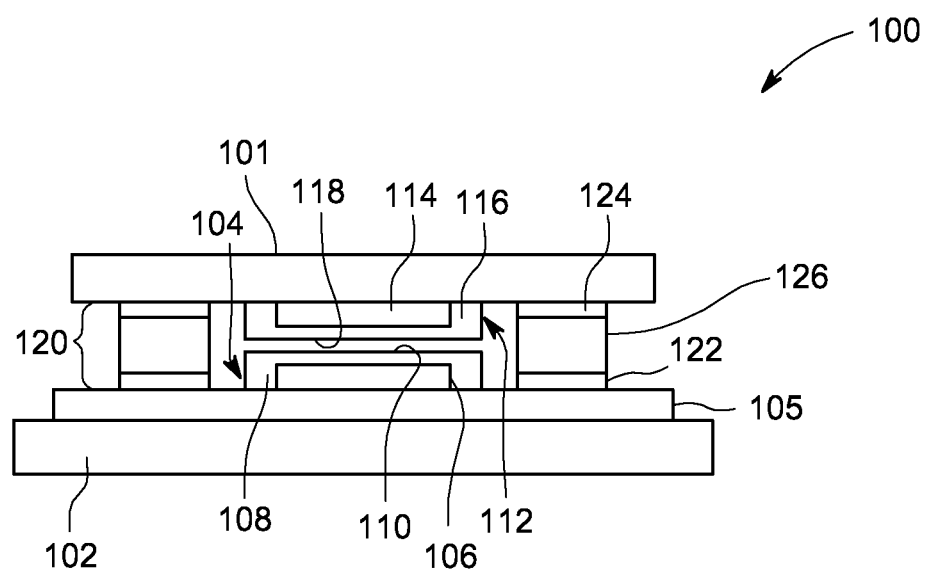
FIGS. 1A-B depict apparatus in accordance with some embodiments of the present invention.

FIG. 1A depicts a side schematic view of an article 100 in accordance with some embodiments of the present invention. The article 100 includes a part 101 and a substrate 102. For example, the substrate 102 may include one or more of silicon (Si), glass, plastic, or other suitable substrate materials. The substrate 102 includes a first binding site 104. As illustrated in FIG. 1, an electrically conductive layer 105 may be disposed between the substrate 102 and the first binding site 104. For example, the electrically conductive layer 105 may include one or more of gold (Au), copper (Cu), aluminum (Al), or other suitable conductive materials.

Figure 1B:
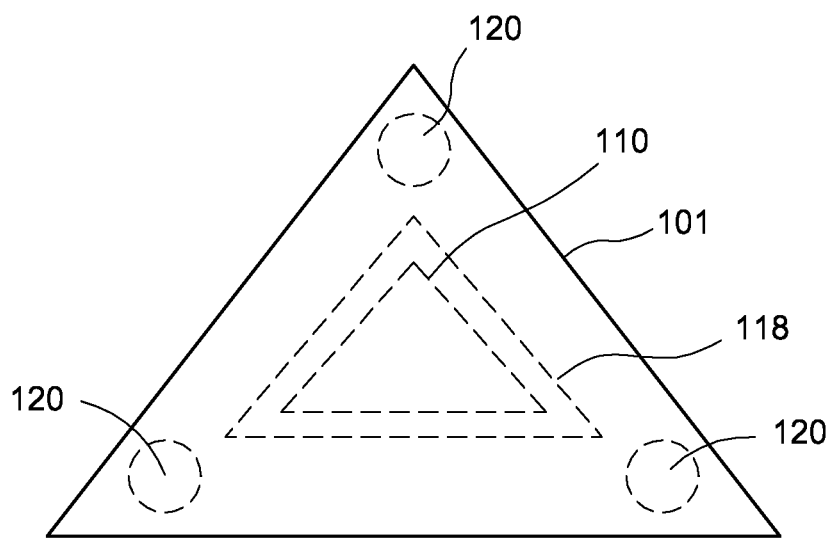

The first binding site 104 may include a first electromagnetic field generating element 106 and a first layer 108. For example, the first magnetic field generating element 106 may include one or more of a polarized permanent magnet, a hard magnet, a polarized permanent electrostatic material, an electrode providing an electro static field, or an electromagnet. The first magnetic field generating element 106 may be covered by the first layer 108, for example, to provide a surface suitable for attachment of a self-assembled monolayer, as described below. The first layer 108 may be formed of one or more of gold (Au), copper (Cu), silicon dioxide ($SiO_2$), or the like. The first layer 108 may include a first shaped surface 110, where the first shaped surface 110 may be utilized to promote alignment of the part 101 with the substrate 102 as discussed below. For example, the first shaped surface 110 may include any suitable shape not having the same radial distance in every direction from a central axis passing through the surface 110. For example, as illustrated in FIG. 1B, one such suitable shape may include a triangle. For example, an unsuitable shape may include a circle. The first shaped surface 110 may include a self-assembled monolayer or any suitable surface for making the first shaped surface 110 one of hydrophobic or hydrophilic.

The part 101 may comprise one or more of transistors, optoelectronic devices, sensors, or other suitable devices or the like. The part 101 may include a second binding, site 112 opposing the first binding site 104. The second binding site 112 may include a second electromagnetic field generating element 114 and a second layer 116. The second binding site 112 may be substantially similar to the first binding site 104 as described above. For example, the second magnetic field generating element 114 may include one or more of a polarized permanent magnet, a hard magnet, a polarized permanent electrostatic material, or a material which is highly permeable to the electromagnetic field lines emanating from the first electromagnetic field generator, such as permalloy, nickel-iron (Ni—Fe), or the like. The second magnetic field generating element 114 may be covered by the second layer 116, for example, to provide a surface suitable for attachment of a self-assembled monolayer, as described below. The second layer 116 may be formed of one or more of gold (Au), copper (Cu), silicon dioxide ($SiO_2$), or the like. The second layer 116 may include a second shaped surface 118, where the second shaped surface 118 may be utilized to promote alignment of the part 101 with the substrate 102 as discussed below. For example, as discussed above with respect to the first shaped surface 110, the second shaped surface 118 may include any suitable shape not having the same radial distance in every direction from a central axis passing through the surface 110. For example, as illustrated in FIG. 1B, one such suitable shape may include a triangle. For example, an unsuitable shape may include a circle. The second shaped surface 118 may include a self-assembled monolayer or any suitable surface for making the second shaped surface 118 one of hydrophobic or hydrophilic for use in the method 200 as discussed below.

As illustrated in FIG. 1B, the first shaped surface 110 may be aligned with the second shaped surface 118. For illustrative purposes, the second shaped surface 118 is drawn as slightly larger in area than the first shaped surface 110. However, this is merely illustrative and in practice, the first and second shaped surfaces 110, 118 may be the same or substantially the same in size and shape.

The article 100 may include a plurality of electrical connections 120 disposed about the first and second binding sites 104, 112, wherein each electrical connection 120 provides an electrical pathway between the substrate 102 and the part 101. For example, each electrical connection 120 may include a first metal layer 122 contacting the substrate 102, for example via the electrically conductive layer 105, as shown, or alternatively directly to the substrate 102 (not shown). Each electrical connection 120 may include a second metal layer 124 contacting the part 101 and a solder layer 126 disposed between the first and second metal layers 122, 124. For example, the first and second metal layers may be formed from one or more of gold (Au), copper (Cu), nickel (Ni), or other suitable conducting materials. For example, the solder layer 126 may be formed from one or more of tin-lead (Sn—Pb), tin-bismuth (Sn—Bi), tin (Sn), or other suitable solder materials.

Figure 2:
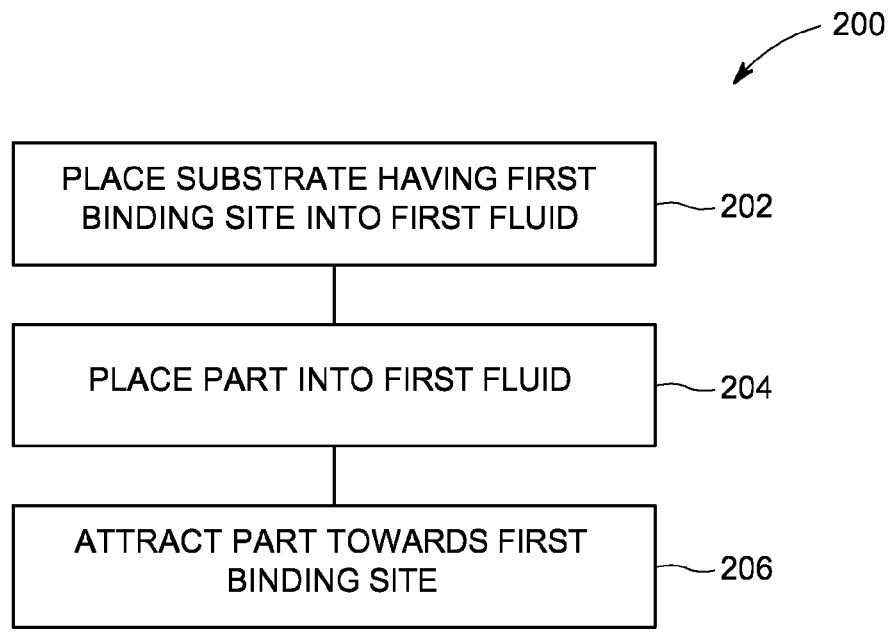
FIG. 2 depicts a flow chart for a method for self-assembling a part on a substrate in accordance with some embodiments of the present invention.

FIG. 2 depicts a flow chart of a method 200 for self-assembling a part on a substrate in accordance with some embodiments of the present invention. For example, the method 220 may be utilized to form the article 100 as illustrated in FIGS. 1A-B by self-assembling the part 101 to the substrate 102. The stages of fabrication of the self-assembly process, or method 200, are respectively depicted in FIGS. 3A-D.

Figure 3A:
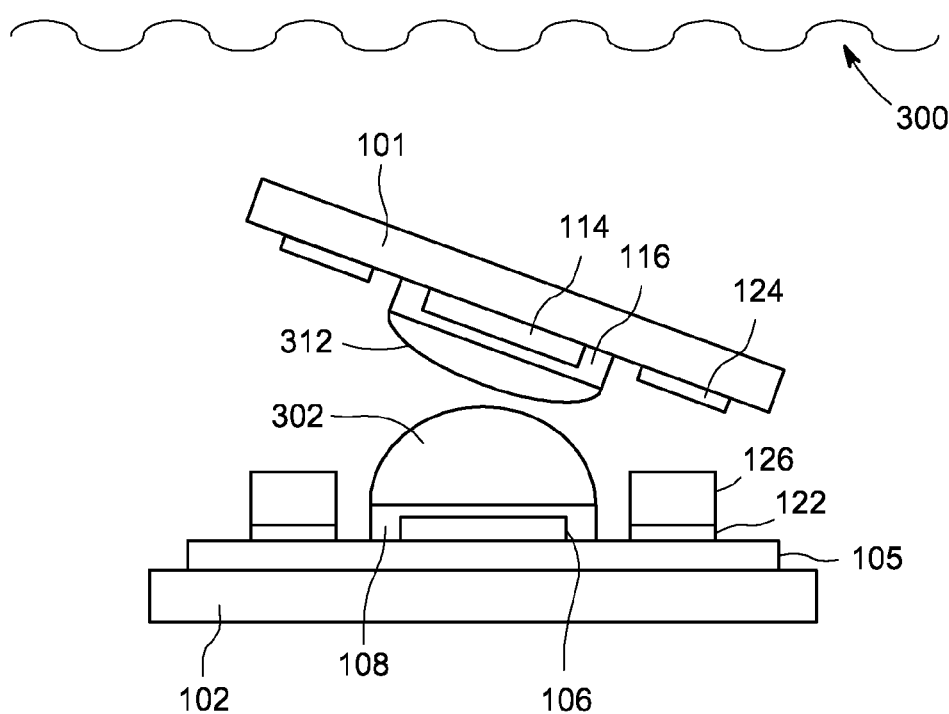
FIGS. 3A-D depict the stages of fabrication for self-assembling a part on a substrate in accordance with some embodiments of the present invention.

The method 200 begins at 202, by placing the substrate 102 in a first fluid 300. For example, as illustrated in FIG. 3A, the substrate 102 may include the electrically conductive layer 105, the first binding site 104, the plurality of first metal layers 122 and the plurality of solder layers 126 disposed thereon when the substrate is placed in the first fluid 300. For example, the first fluid 300 may include one or more of water ($H_2O$), ethylene glycol, glycerol, or the like. A first droplet 302 of a second fluid may be conformably disposed on the first shaped surface 110. The second fluid may be immiscible in the first fluid 300. For example, the second fluid may be, for example, one or more of hexane ($C_6H_{12}$), hexadecane ($C_6H_{32}$), or any suitable fluid which is immiscible in water. In some embodiments, the first droplet 302 may be formed on a self-assembled monolayer included on the first shaped surface 110 or on any suitable surface which permits the second fluid to wet the first shaped surface 110 to form the first droplet 302.

Figure 3B:
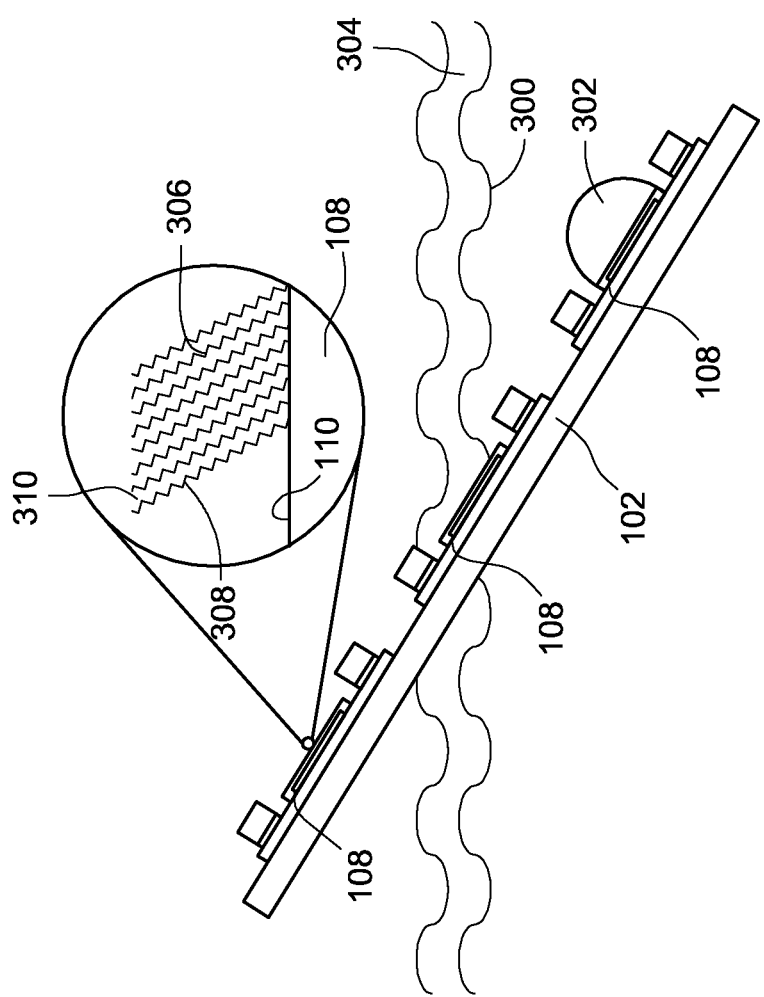

In some embodiments, to form the first droplet 302, the substrate 102 may be placed into the second fluid prior to placing the substrate into the first fluid 300. For example, the second fluid may wet the first shaped surface 110 while not wetting other surfaces of the substrate 102. Alternatively, the second fluid 304 may be disposed above the first fluid 300 and the substrate 102 may passed through the second fluid 304 to enter the first fluid 300 as illustrated in FIG. 3B. Further, an exemplary self assembled monolayer is illustrated in FIG. 36. For example, as shown, the self-assembled monolayer 306 may be disposed on the first shaped surface 110 and may comprise a plurality of molecules 308, each molecule may include a hydrophobic group 310 that contacts the second fluid 304. Alternatively, depending on the identity of the first and second fluids, a hydrophilic group may be used.

At 204, the part 101 may be placed into the first fluid as illustrated in FIG. 3A. For example, the part 101 may include the second binding site 112 and the plurality of second metal layers 124 as illustrated in FIG. 3A. The part 101 may include a second droplet 312 conformably disposed on the second shaped surface 118, wherein the second droplet is immiscible in the first fluid 300. For example, the second droplet 312 may be formed from one or more of the second fluids as discussed above with respect to the first droplet 302. The first droplet 302 and the second droplet 312 may be made from the same fluid or from different fluids. Similar to embodiments discussed above at 202, the part 101 may be placed into the second fluid prior to the placing the part 101 in the first fluid to wet the second shaped surface 118 of the second binding site 112 to form the second droplet 312 on the second shaped surface 116. Alternatively, the second fluid 304 may be disposed above the first fluid 300 and the part 101 may be passed through the second fluid 304 prior to enter the first fluid 300, similar to embodiments discussed above at 202 and illustrated in FIG. 36. Embodiments of a self assembled monolayer discussed above at 202, such as the exemplary self assembled monolayer 306, may be applied to the second shaped surface 116 and used to wet the second shaped surface 118 to form the second droplet 312.

Figure 3C:
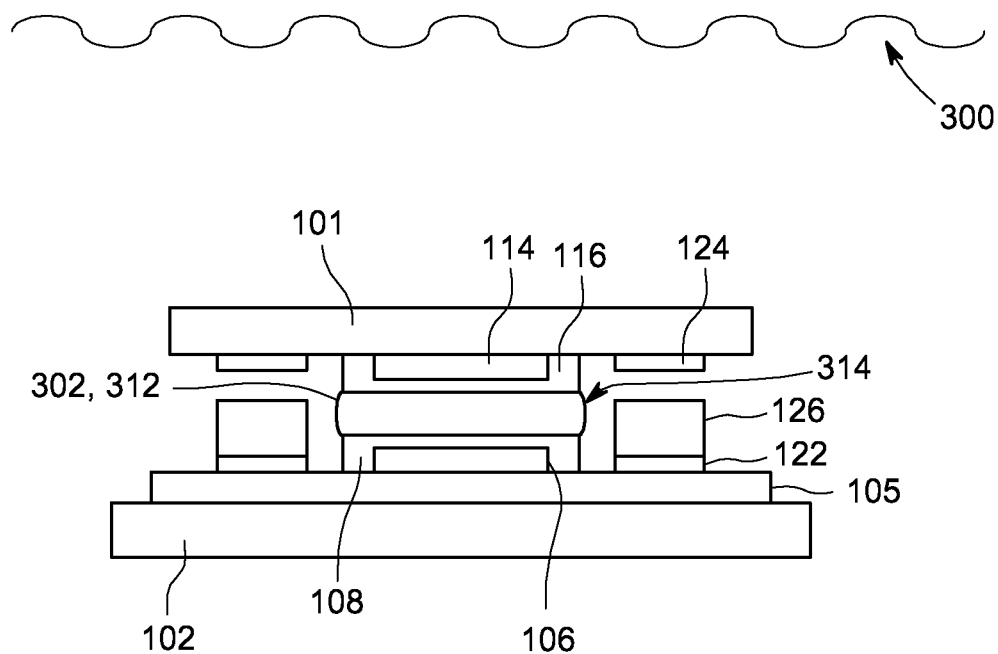
Figure 3D:
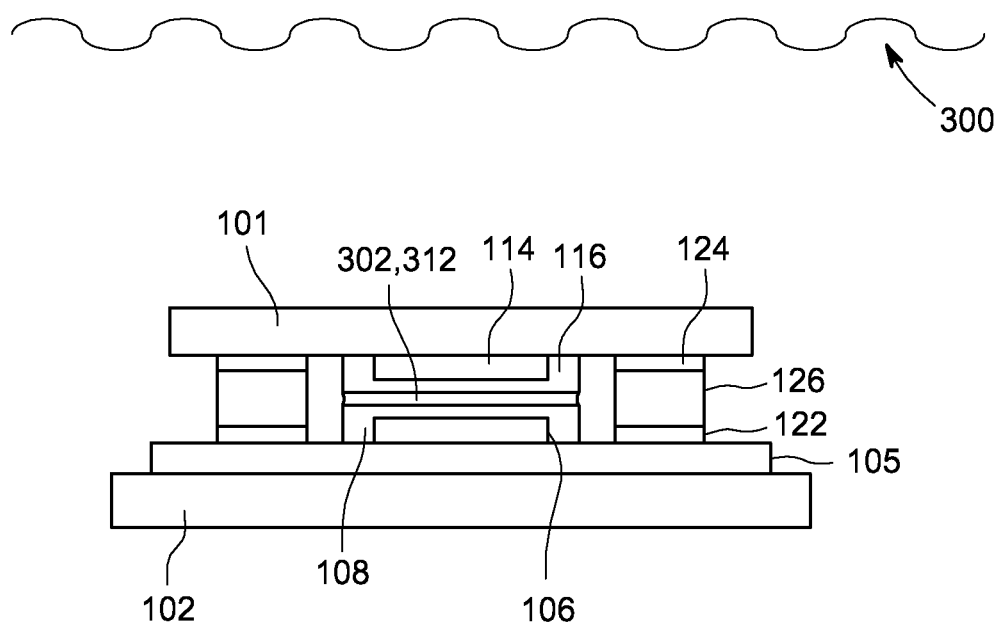

At 206, the part 101 may be attracted towards the first binding site 114 as illustrated in FIGS. 3A, 3C-D. For example, the first and second electromagnetic field generating elements 106, 114 may be used to attract the part 101 to the substrate 102 such that the first and second droplets 302, 312 solubilize with each other as illustrated in FIG. 3C. For example, as the first and second droplets 302, 312 solubilize, an equilibrium may be formed between an attractive force resulting from the first and second electromagnetic field generating elements 106, 114 and a repulsive force between the solubilized first and second droplets 302, 312 and the first fluid 300 such that the part 101 is free to rotate about the first binding site 114 as shown in FIG. 3C. For example, the solubilized first and second droplets 302, 312 may act as a lubricant to aid rotation and prevent the part 101 from getting stuck in a misaligned orientation. The repulsive force may be minimized by minimizing an exposed surface area 314 of the solubilized first and second droplets 302, 312 with respect to the first fluid 300. The minimization of the repulsive force may occur when the first and second shaped surfaces 110, 116 rotate into an alignment (such as an alignment as illustrated in FIG. 1B) causing the part 101 to aligned with the first binding site 114. For example, the part 101 may be considered is aligned when the plurality second metal layers 124 disposed on the part 101 are aligned with the corresponding plurality of solder layers 126 disposed on the substrate 102. Further, the shape of the first and second shaped surfaces 110, 118 may be selected such that only by their alignment may the repulsive force be minimized. In some embodiments, the first droplet 302 may also preferentially wet the surface 118, resulting in the same combined droplet 302, 312 depicted in FIG. 3C and leading to the same functions described above.

Once the part 101 is aligned with the substrate 102, the part 101 may be contacted with the substrate 102 such that the plurality of first metal layers 124 contact the corresponding plurality of solder layers 126. For example, to contact the part 101 with the substrate 102, the solubilized first and second droplets 302, 312 may be removed such that the attractive force between the first and second electromagnetic field generating elements 106, 114 pulls the first metal layers 124 and corresponding solder layers 126 together.

In some embodiments, the solubilized first and second droplets 302, 312 may be removed by adding a third fluid (not shown) to the first fluid 300, where the third fluid may be soluble in both the first and second fluids. Exemplary third fluids may include one or more of ethanol ($CH_3CH_2OH$), acetone (($CH_3$)$_2$CO). methanol ($CH_3OH$), or the like. For example, the third fluid may dissolve the solubilized first and second droplets 302, 312 as illustrated in FIG. 3O such that the plurality of first metal layers 124 contact the corresponding plurality of solder layers 126. Once the part 101 is aligned with the substrate 102 and the solubilized first and second droplets 302, 312 have been removed, the solder layers 126 may be heated to form the electrical connections 120. For example, the substrate 102 and part 101 may be globally heated or the solder layers 126 may be locally heated. In some embodiments, the substrate 102 including the aligned part 101 may be removed from the first fluid 300. In some embodiments, the substrate 102 and part 101 may be removed, for example, such that higher temperatures than the boiling point of the first fluid 300 may be used to melt the solder layers 126. The substrate 102 may be heated to melt the solder layers 126 such that the electrical connections 120 are formed. For example, the substrate 102 and part 101 may be heated under an inert atmosphere or the like to melt the solder layers 126. Alternatively, the first fluid 300 may be exchanged with a fourth fluid having a higher boiling point than the first fluid 300. Exemplary fourth fluids may include glycerol, ethylene glycol, ionic liquids, or the like. The substrate 102 may be heated in the fourth fluid to melt the solder layers 126 to form the electrical connections 120.

While the foregoing is directed to embodiments of the present invention, other and further embodiments of the invention may be devised without departing from the basic scope thereof.

The invention claimed is:

1. A method of self-assembling a part on a substrate, comprising:
   placing a substrate into a first fluid, the substrate including a first binding site capable of generating a first electromagnetic field and having a first shaped surface with a first droplet conformably disposed on the first shaped surface, wherein the first droplet is immiscible in the first fluid;
   placing a part into the first fluid, the part having a second binding site capable of generating a second electromagnetic field and having a second shaped surface with a second droplet conformably disposed on the second shaped surface, wherein the second droplet is immiscible in the first fluid; and
   attracting the part towards the first binding site using the first and second electromagnetic fields such that the first and second droplets solubilize with each other forming an equilibrium between an attractive force between the first and second electromagnetic fields and a repulsive force between the solubilized first and second droplets and the first fluid such that the part is free to rotate about the first binding site to minimize the repulsive force by minimizing an exposed surface area of the solubilized first and second droplets with respect to the first fluid when the first and second shaped surfaces rotate into an alignment causing the part to align with the first binding site.

2. The method of claim 1, further comprising:
   placing the substrate into a second fluid prior to placing the substrate into the first fluid, wherein the second fluid is immiscible in the first fluid and wherein the second fluid wets the first shaped surface to form the first droplet on the first shaped surface.

3. The method of claim 2, wherein the second fluid is disposed above the first fluid and wherein the substrate is passed through the second fluid to enter the first fluid.

4. The method of claim 2, wherein the first shaped surface includes a self-assembled monolayer that causes the second fluid to wet the first shaped surface.

5. The method of claim 4, wherein the self-assembled monolayer comprises a plurality of molecules, each molecule including a hydrophobic group that contacts the second fluid.

6. The method of claim 1, further comprising:
   placing the part into a second fluid prior to placing the part into the first fluid, wherein the second fluid is immiscible in the first fluid and wherein the second fluid wets the second shaped surface to form the second droplet on the second shaped surface.

7. The method of claim 6, wherein the second fluid is disposed above the first fluid and wherein the part is passed through the second fluid to enter the first fluid.

8. The method of claim 6, wherein the second shaped surface include a self-assembled monolayer that causes the second fluid to wet the second shaped surface.

9. The method of claim 8, wherein the self-assembled monolayer comprises a plurality of molecules, each molecule including a hydrophobic group that contacts the second fluid.

10. The method of claim 1, wherein the first and second droplets comprise a second fluid, and further comprising:
dissolving the solubilized first and second droplets in a third fluid added to the first fluid after the part is aligned, wherein the third fluid is soluble in both the first and second fluids.

11. The method of claim 10, further comprises:
contacting a plurality of solder layers disposed about the first binding site with corresponding plurality of second metal layers disposed about the second binding site by dissolving the solubilized first and second droplets.

12. The method of claim 11, wherein the plurality of solder layers are disposed on a plurality of first metal layers disposed about the first binding site.

13. The method of claim 11, further comprising:
removing the substrate including the aligned part from the first fluid; and
heating the substrate to melt the solder layers such that an electrical connection is formed between the plurality of second metal layers and a corresponding plurality of first metal layers disposed about the first binding site on the substrate.

14. The method of claim 11, further comprising:
exchanging the first fluid with a fourth fluid having a higher boiling point than the first fluid; and
heating the substrate in the fourth fluid to melt the solder layers such that an electrical connection is formed between the plurality of second metal layers and a corresponding plurality of first metal layers disposed about the first binding site on the substrate.

15. The method of 1, further comprising:
generating the first electromagnetic field using one or more of a polarized permanent magnet, a hard magnet, a polarized permanent electrostatic material, an electrode providing an electro static field, or an electromagnet.

16. The method of claim 1, further comprising:
generating the second electromagnetic field using one or more of a polarized permanent magnet, a hard magnet, a polarized permanent electrostatic material, or a material which is highly permeable to the electromagnetic field lines emanating from the first electromagnetic field generator.

* * * * *